US006477695B1

(12) United States Patent
Gandhi

(10) Patent No.: US 6,477,695 B1
(45) Date of Patent: Nov. 5, 2002

(54) METHODS FOR DESIGNING STANDARD CELL TRANSISTOR STRUCTURES

(75) Inventor: Dhrumil Gandhi, Cupertino, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 09/337,999

(22) Filed: Jun. 22, 1999

Related U.S. Application Data

(60) Provisional application No. 60/111,632, filed on Dec. 9, 1998.

(51) Int. Cl.[7] .......................... G06F 17/50; H03K 19/00
(52) U.S. Cl. ............................................. 716/17; 716/1
(58) Field of Search ...................... 395/500.18; 716/17, 716/1

(56) References Cited

U.S. PATENT DOCUMENTS

| | | | | |
|---|---|---|---|---|
| 5,038,192 A | * | 8/1991 | Bonneau et al. | 357/45 |
| 5,598,347 A | * | 1/1997 | Iwasaki | 364/491 |
| 5,619,418 A | * | 4/1997 | Blaauw et al. | 364/489 |
| 5,689,432 A | * | 11/1997 | Blaauw et al. | 364/490 |
| 5,737,236 A | * | 4/1998 | Maziasz et al. | 364/490 |
| 5,796,624 A | * | 8/1998 | Sridhar et al. | 364/489 |
| 5,802,349 A | * | 9/1998 | Rigg et al. | 395/500 |
| 5,880,967 A | * | 3/1999 | Jyu et al. | 364/489 |

OTHER PUBLICATIONS

Kao et al., Algorithms for Automatic Transistor Sizing in CMOS Digital Circuits, Proceedings of the 22nd ACM/IEEE Conference on Design Automation, pp. 781–784, Jun. 1985.*

Shyu et al., Optimization–Based Transistor Sizing, IEEE Journal of Solid–State Circuits, pp. 400–409, Apr. 1998.*

M. Yamada et al., Synergistic Power/Area Optimization With Transistor Sizing and Wire Length Minimization, IEEE Symposium of Low Power Electronics, pp. 50–51, Oct. 1994.*

C. Tretz et al., CMOS Transistor Sizing for Minimization of Energy–Delay Product, Sixth Great Lakes Symposium on VLSI, pp. 168–173, Mar. 1996.*

* cited by examiner

*Primary Examiner*—Matthew Smith
*Assistant Examiner*—A. M. Thompson
(74) *Attorney, Agent, or Firm*—Martine & Penilla, LLP

(57) ABSTRACT

Disclosed are methods for designing standard cell transistor layouts for minimizing transistor delays and for minimizing power consumption. The method of minimizing transistor delays includes defining a transistor model for a P-type transistor and an N-type transistor of a CMOS standard cell. The method then includes minimizing a ratio between the P-type transistor and the N-type transistor. The ratio is defined by dividing a P-type gate width of the P-type transistor by an N-type gate width of the N-type transistor. The optimizing is performed by substantially minimizing an average delay for the transistor structure. In this embodiment, the CMOS standard cell will define a transistor structure that is implemented to make a logic circuit. The CMOS standard cell is one of a library of standard cells, where each standard cell defines a particular logic circuit.

22 Claims, 7 Drawing Sheets

US 6,477,695 B1

METHODS FOR DESIGNING STANDARD CELL TRANSISTOR STRUCTURES

CROSS REFERENCE TO RELATED APPLICATIONS

This application claims priority from U.S. Provisional Patent Application No. 60/111,632, filed Dec. 9, 1998, and entitled "Method For Designing Standard Cell Transistor Layout." This provisional application is herein incorporated by reference.

BACKGROUND OF THE INVENTION

1. Field of the Invention

The present invention relates generally to integrated circuits, and more particularly to methods for sizing layout design geometries of transistor gates to achieve specific optimized performance characteristics.

2. Description of the Related Art

In the design of semiconductor integrated circuits, circuit designers commonly utilize what are known as "standard cells" to achieve a particular circuit response. Standard cells are essentially pre-designed layouts of transistors that are wired to perform a certain type of logical function. By way of example, a company, such as Artisan Components, Inc. of Sunnyvale, Calif., designs standard cell libraries incorporating many different types of standard cells, each for performing a specific type of logical operation or operations. The standard cells of the standard cell library are then used by integrated circuit design engineers in conjunction with modeling software to produce a larger scale circuit design that meets a particular specification.

A popular and most commonly used modeling software is a hardware description language (HDL) named "Verilog" (IEEE Verilog Standard 1364, 1995). Using Verilog, designers are able to describe each component of an integrated circuit in terms of its functional behavior as well as its implementation. Once a circuit design using Verilog is complete, the Verilog code is synthesized to generate what is referred to as a "netlist." A netlist is essentially a list of "nets," which specify components (i.e., standard cells) and their interconnections which are designed to meet the circuit design's performance constraints.

The actual placement plan of the standard cells on silicon and the topography of wiring is reserved for a subsequent "layout" stage. In the layout stage, software tool, commonly referred to as "place and route" software, is used to design the actual wiring that will ultimately interconnect the standard cells together. To do this, each standard cell typically has one or more pins for interconnection with pins of other standard cells. The netlist therefore defines the connectivity between pins of the various standard cells of an integrated circuit device.

Although the design of integrated circuits using specialized software has greatly simplified the design process, the ultimate design is only going to perform as well as the individual standard cells. That is, if standard cells are not individually optimized to meet a specific performance characteristic, the designer of the larger integrated circuit design will find it difficult, and many times, impossible to optimize the resulting larger design to meet some pre-set operation or performance characteristic.

To facilitate discussion, FIG. 1 shows a prior art standard cell 100 having a p-type transistor and an n-type transistor. The standard cell 100 has a cell height ($H_{cell}$) and a cell length ($L_{cell}$). Although standard cells that represent true logical circuits may implement additional transistors and have associated interconnection wiring (not shown) defined, this simplistic transistor level illustration shows how the standard cell 100 is divided in two parts. As is general practice in CMOS design, one part of the standard cell 100 is for p-type transistors 102 and the other part is for n-type transistors 104. In some situations, standard cell designers designed the gate width "Wp" of the p-type transistor 102 to be equal to the gate width "Wn" of the n-type transistor 104. A problem with this design is that p-type transistors are generally know to be weaker in driving strength than their n-type transistor counterparts. As a result, when a standard cell is designed having N and P type transistors with equal gate widths, the designer will need more chip space to design additional p-type transistors to meet the desired drive characteristics.

To combat this known problem, designers shifted their efforts in order come up with standard cells, in which, the drive strength of the p-type transistors substantially equaled the drive strength of the n-type transistors. To achieve this "balanced" drive standard cell design, designers increased the size of the p-type transistors such that they were about 2 to 3 times larger in width that the stronger driving n-type transistors (i.e., ratio={Wp/Wn}=2~3). Thus, the simplistic design of FIG. 1 shows a case in which the p-type transistor has a gate width Wp that is about 2 or 3 times larger than the gate width Wn of the n-type transistor, thus achieving the desired balanced drive.

An undesirable impact of having P and N type transistors of standard cells with balanced drive is, however, that the standard cell is not optimized with transistor speed nor power consumption in mind. As a result, most balanced drive standard cell designs present substantial difficulties (e.g., due to a fixed standard cell delay) to circuit designers that must meet very tight specifications that require minimum delays in order to implement a fast integrated circuit design. Similarly, designers that face particular constraints to reduce power consumption are also currently required to assume a fixed power consumption specification for the particular standard cell and must, if possible, perform other possibly more expensive design modifications to control power consumption.

In view of the foregoing, there is a need for methods for designing standard cell designs that enable precise optimization of transistor delay characteristics. There is also a need for methods for designing standard cell designs that enable precise optimization of transistor power consumption characteristics.

SUMMARY OF THE INVENTION

Broadly speaking, the present invention fills these needs by providing methods for designing standard cell transistors to obtain optimum results in terms of reduced gate delay and power consumption characteristics. It should be appreciated that the present invention can be implemented in numerous ways, including as a process, an apparatus, a system, a computer readable media, a device, or a method. Several embodiments of the present invention are described below.

In one embodiment, a method for designing standard cell transistor layouts is disclosed. The method includes defining a transistor model for a P-type transistor and an N-type transistor of a CMOS standard cell. The method then includes optimizing a ratio between the P-type transistor and the N-type transistor. The ratio is defined by dividing a P-type gate width of the P-type transistor by an N-type gate width of the N-type transistor. The optimizing is performed by substantially minimizing an average delay for the transistor structure. In this embodiment, the CMOS standard cell will define a transistor structure that is implemented to make a logic circuit. The CMOS standard cell is one of a library of standard cells, where each standard cell defines a particular logic circuit.

In yet another embodiment, a method for sizing transistors of a standard cell is disclosed. The method includes defining a transistor structure for the standard cell. The transistor structure defines a logic circuit upon being interconnected using interconnect metallization and conductive vias structures. The method then includes defining a transistor model for a P-type transistor and an N-type transistor of the standard cell. The P-type transistor is oriented on a first side of the standard cell and the N-type transistor is oriented on a second side of the standard cell. The method further includes generating a plurality of ratios between the P-type transistor and the N-type transistor, such that each of the plurality of ratios are derived by dividing a P-type gate width of the P-type transistor by an N-type gate width of the N-type transistor. The method then generates a plurality of average delays for the transistor structure of the standard cell. In this embodiment, each of the generated plurality of average delays is associated with a corresponding one of the plurality of ratios. The method then proceeds to identify an optimum ratio from the plurality of ratios by finding a low one of the plurality of average delays. In this embodiment, the low one the plurality of average delays is used to size the P-type gate width of the P-type transistor and the N-type gate width of the N-type transistor to obtain the most optimum reduced delay for a given standard cell design.

In still another embodiment, a method for sizing transistors of a standard cell for reduced power consumption is disclosed. The method includes defining a transistor structure for the standard cell. The transistor structure defines a logic circuit upon being interconnected using interconnect metallization and conductive vias structures. The method also includes defining a transistor model for a P-type transistor and an N-type transistor of the standard cell. The P-type transistor is oriented on a first side of the standard cell and the N-type transistor is oriented on a second side of the standard cell. Then, the method includes generating a plurality of ratios between the P-type transistor and the N-type transistor, such that each of the plurality of ratios is derived by dividing a P-type gate width of the P-type transistor by an N-type gate width of the N-type transistor. The method then includes generating a plurality of power consumption data for the transistor structure of the standard cell, such that each of the generated plurality of power consumption data is associated with corresponding ones of the plurality of ratios. The method now proceeds to identify an optimum ratio from the plurality of ratios by finding a low one of the plurality of power consumption data. The P-type gate width of the P-type transistor and the N-type gate width of the N-type transistor are now sized using the identified optimum ratio.

Advantageously, the various embodiments of the present invention provide methods for optimizing standard cell transistor layout design to produce logic circuits that have reduced capacitive loading delays. Accordingly, it is now possible to design faster standard cell circuitry on the same amount of chip space, without having to unnecessarily increase the number of transistors to achieve a desired faster speed. It is also important to take note that once the optimum ratio or range of ratios are found, the obtained ratios can be applied to any size standard cell, with the same functionality, and achieve substantially the same delay reducing benefits. In addition, because less transistors are needed in standard cells to achieve the optimum reduced delay, the layout of an integrated circuit can be made substantially more dense, thereby saving valuable chip space.

Furthermore, because the transistor layout is made more dense, the interconnect routing will be relaxed because there will be more open chip space over which to route the metallization interconnect lines. In another embodiment, the ratio optimization techniques are applicable for designing transistor devices to produce the least power consuming integrated circuit device. Not only do the embodiments of the present invention facilitate the design of standard cell transistor gate dimensions, the benefits of the optimization can be easily analyzed either numerically or by way of inspection of easy to read graphical plots. These and other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention of methods for designing standard cell transistors to obtain optimum results in terms of reduced gate delay and power consumption characteristics is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
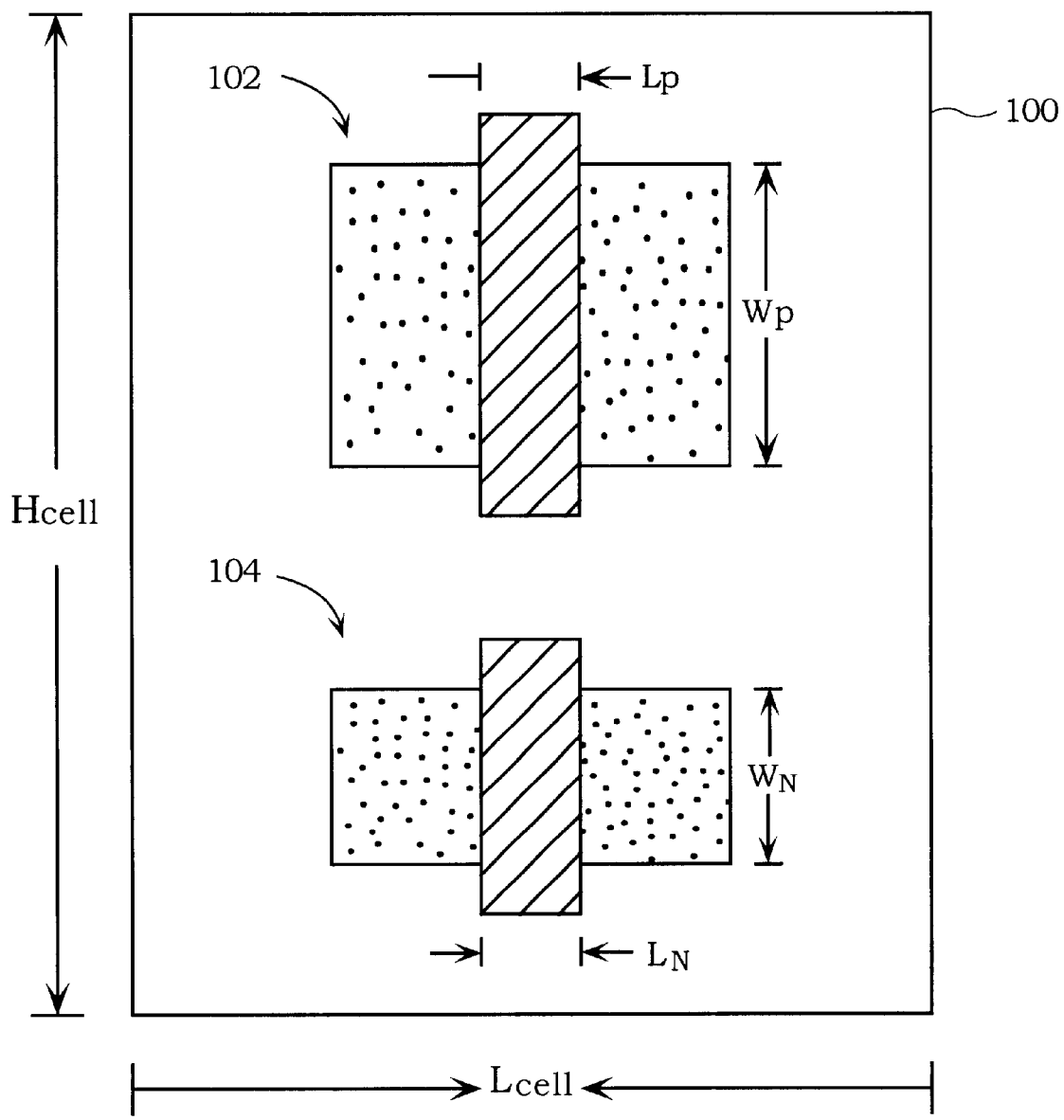
FIG. 1 shows a prior art standard cell having a p-type transistor and an n-type transistor having balanced, non-optimized transistor drives.
Figure 2A:
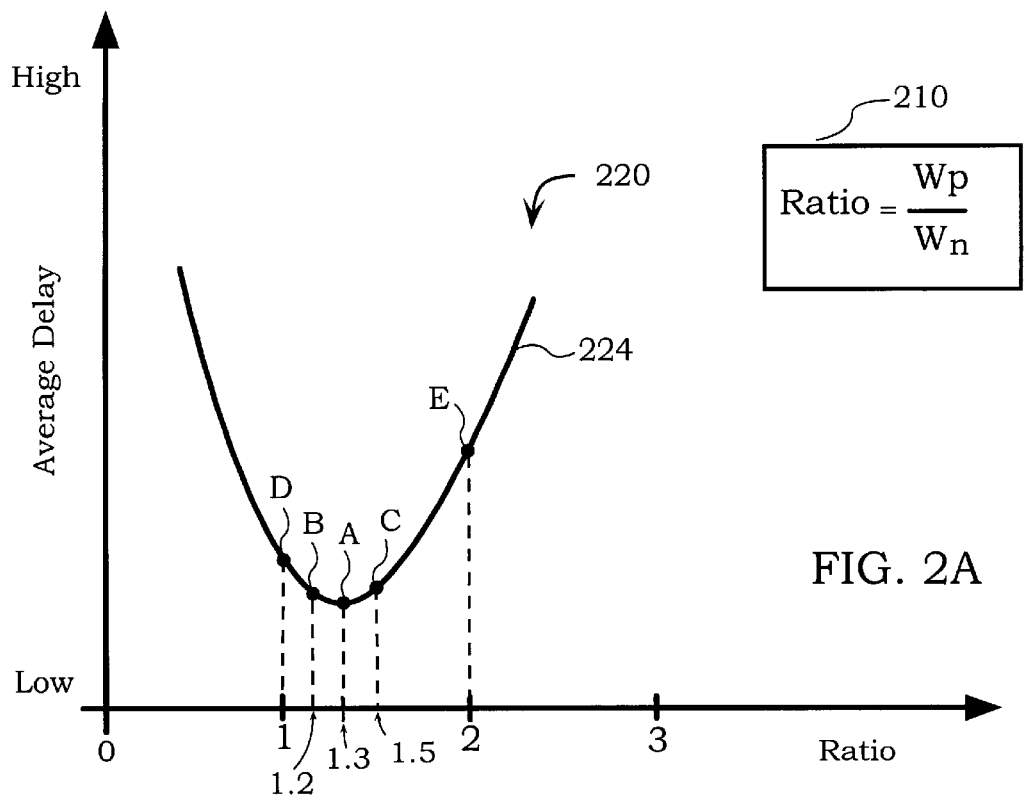
FIG. 2A illustrates a plot of an average delay versus a transistor gate width ratio in accordance with one embodiment of the present invention.

FIG. 2A illustrates a plot 220 of an average delay versus a transistor gate width ratio 210 in accordance with one embodiment of the present invention. As shown, the plot 220 has a curve 224 in a form that resembles a parabola having a minima at a point A. As data points for the ratio span between zero and about 3, the average delay initially begins to decrease until it approaches point A at a ratio of about 1.3 and then begins to increase as the ratio keeps increasing out to 3. In this example, when the ratio is fixed to 1, as conventionally done in order to keep the transistor gate width Wp of the P-type transistor and the transistor gate width Wn of the N-type transistors equal, a point D on the curve 224 would result. As can be appreciated, having a fixed ratio of 1 will not provide the standard cell with the most optimum situation for decreasing the average delay for the transistor structures. In a similar manner, if a balanced drive was applied to the standard cell, that would require the ratio to be about 2, thereby producing a point E on the curve 224. In this case, having a balanced drive could cause the average delay to be substantially greater than would be optimum for the particular design.

As a result, in accordance with one embodiment of the present invention, a method is disclosed for determining the most optimum ratio between the transistor gate widths of the P-type and the N-type transistor structure while also achieving the lowest average delay possible. However, in accordance with the present invention, if the lowest average delay is found at point A, it is also possible to select other point values between an acceptable range near the minimum of the curve 224. In one embodiment, the ratio may range between a point B and point C, which in this example may represent acceptable ratios extending between 1.2 and 1.5, respectively.

Therefore, the designer is provided with a flexible way of sizing the transistor gate widths of the P-type and the N-type transistor structure to fit a particular standard cell size, while also achieving the most desirable average delay within the range believed to be acceptable by the designer.

Figure 2B:
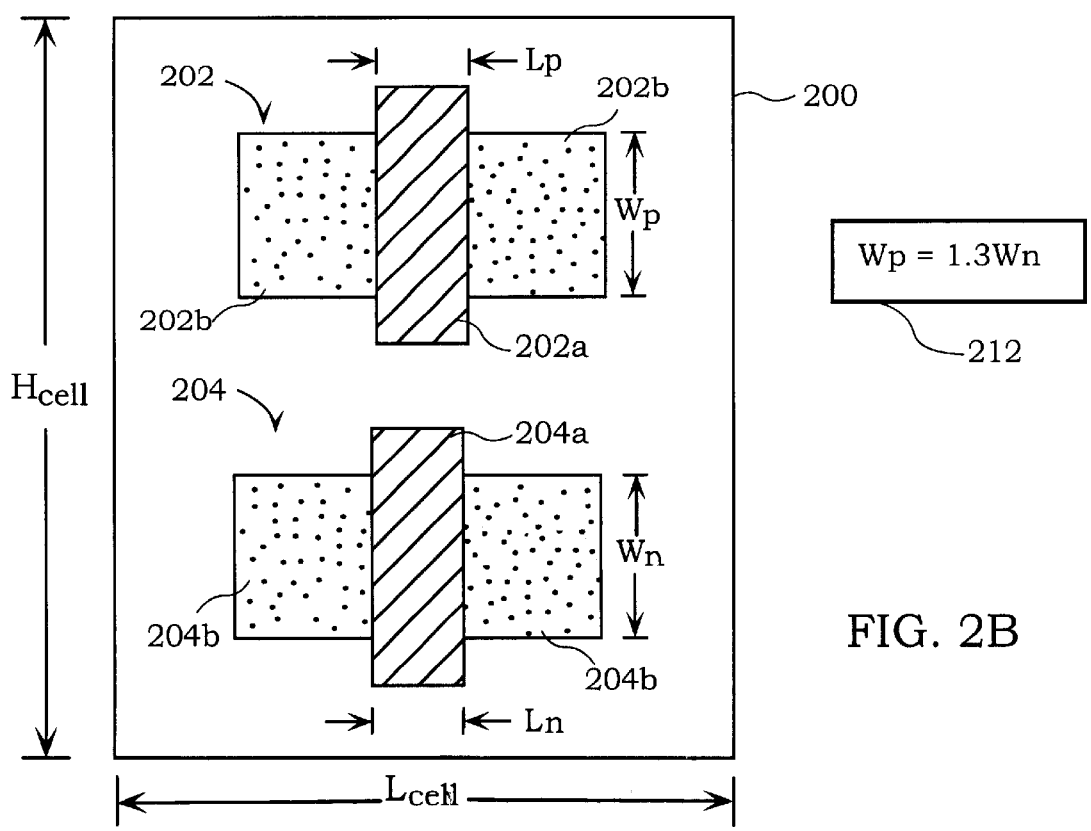
FIG. 2B is a top view of a standard cell optimized for average delay as shown in FIG. 2A, in accordance with one embodiment of the present invention.

FIG. 2B is a top view of a standard cell 200 optimized for average delay as shown in FIG. 2A, in accordance with one embodiment of the present invention. In this example, the standard cell 200 is divided into two parts. The first part has a P-type transistor 202 having a transistor gate length Lp and a transistor gate width Wp. The second part of the standard cell 200 has an N-type transistor 204 having a transistor gate length Ln, and a transistor gate width Wn. For ease of reference, the P-type transistor has a gate 202a and diffusions regions 202b, and the N-type transistor has a gate 204a and diffusion regions 204b.

The standard cell is also identified having a cell height $H_{cell}$ and a length $L_{cell}$. In order to optimize the gate width of the P-type transistor Wp and the gate width of the N-type transistor Wn, reference is made to the plot 202 in order to identify a desired ratio that will bring about the most optimum average delay for the particular set of transistors being implemented in the standard cell 200. As mentioned above, point A brings about a ratio of about 1.3, which will therefore make the P-type transistor's gate width Wp 1.3 times greater than that of the N-type transistor's width 212 Wn.

Although the standard cell 200 is shown as a simplistic arrangement of a single N-type and a single P-type transistor, it should be understood that standard cells are capable of implementing any number of N-type transistor and P-type transistor structures or circuits that may be required to carry out the type logic circuit implementation once the wiring is completed on the various metal levels of the standard cell. For more information on different types of standard cells that may be included in a standard cell library, reference may be made to a commonly assigned U.S. patent application entitled "Cell Architecture With Local Interconnect and Method for Making Same", having application Ser. No. 09/159,264, and filed Sep. 23, 1998. This application is hereby incorporated by reference. Accordingly, the sizing of the P-type transistor gate widths and the N-type transistor gate widths may be performed on any type of standard cell, whether it be for an inverter logic gate, a NAND logic gate, a NOR logic gate, an AND logic gate, a D flip flop logic device, etc.

Figure 2C:
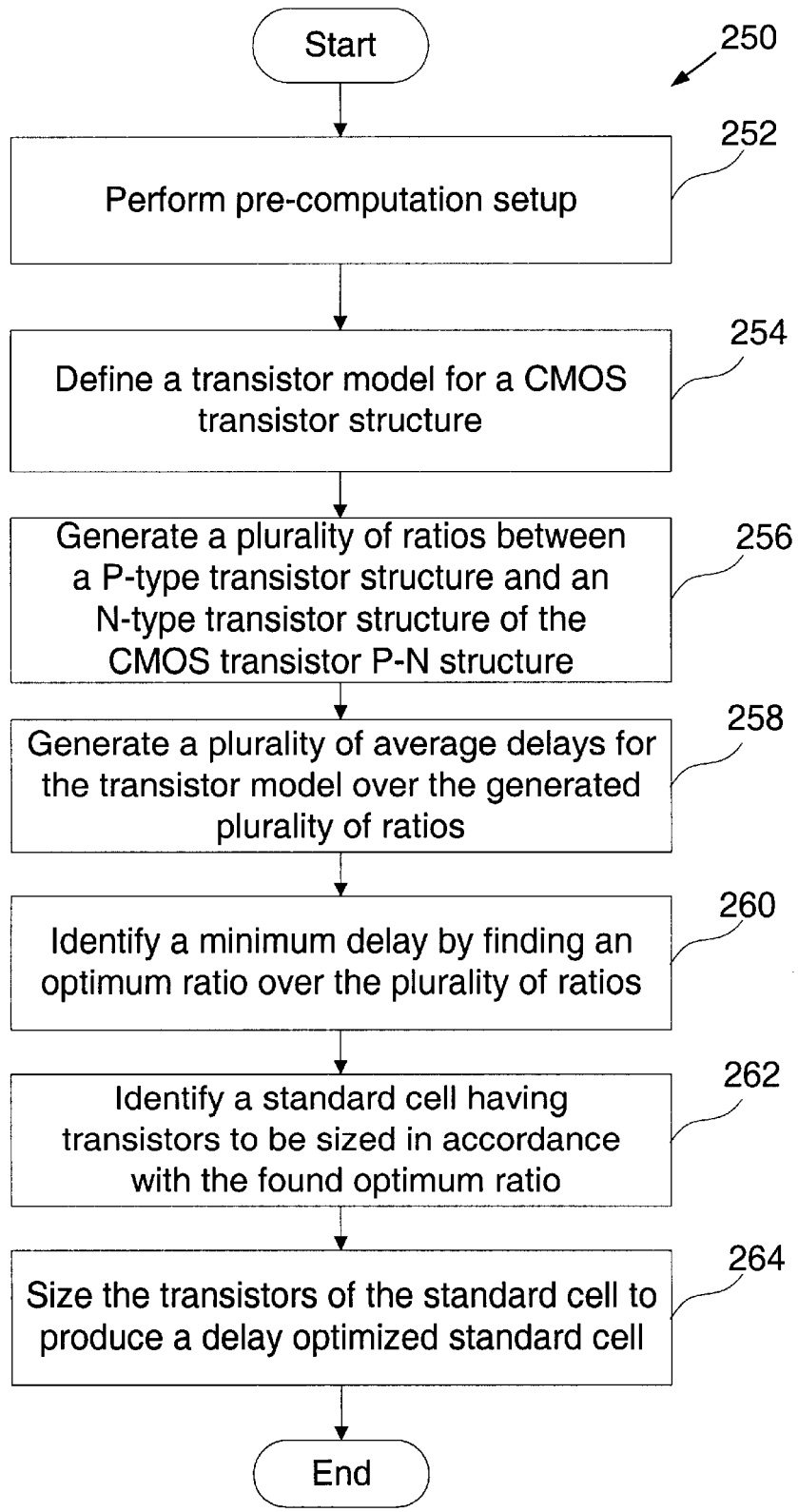
FIG. 2C illustrates a flowchart identifying operations for optimizing the transistor gate width ratio in accordance with one embodiment of the present invention.

FIG. 2C illustrates a flowchart 250 in accordance with one embodiment of the present invention. The flowchart 250 begins at an operation 252 where pre-computation setup operations are performed. The pre-computation setup operations may include determining the type of standard cell for which transistor gate width optimization is desired. Once the type of standard cell has been identified, a standard cell height ($H_{cell}$) is provided as a starting point. Once the standard cell height has been provided, a set of design rules that will be used for laying out the standard cell are defined. Typically, the design rules may be specific to each CMOS process technology that may be used for fabricating the desired standard cell.

For example, if the CMOS process technology is a 0.25 micron technology, a particular set of design rules that define parameters such as minimum inter-feature separations, minimum conductive via dimensions, and other well known rules are defined. Although a cell height $H_{cell}$ in the pre-computation setup operation 252 is requested as an initial input, the resulting optimization will produce a ratio or range of acceptable ratios that are independent of the initial cell height $H_{cell}$. Accordingly, the optimized ratios that are achieved by implementing the method in accordance with the present invention, may be applied to the transistor gate widths of any standard cell having any particular height.

Once the pre-computation setup is complete in operation 252, the method will proceed to an operation 254. In operation 254, a transistor model for a CMOS transistor pair structure/circuitry of the standard cell that is to be optimized for speed is defined. As is well known, transistor models are generally used by semiconductor design engineers in order to replicate in a computer simulation what the response of transistor devices will be after they are implemented in silicon. For example, a well known simulation program such as H SPICE, which is available from AVANT! Corporation, of Fremont, Calif., or any other suitable simulation program may be used in order to produce the desired transistor models implemented in operation 254.

The method now proceeds to an operation 256 where a plurality of ratios between a P-type transistor structure and an N-type transistor structure of the CMOS transistor P-N structure are generated. The plurality of ratios will preferably span a range that will take into account situations in which the P-type transistor gate widths are many times greater than the N-type transistor gate widths, to situations in which the N-type transistor gate widths are many times greater than the P-type transistor gate widths. At the center of this range, a ratio of 1 will define the situation in which the transistor gate widths of the P-type transistor and the N-type transistor are identical. Of course, a suitably smaller range of ratios between the P-type transistor gate widths and the N-type transistor gate widths may also be implemented.

The method now moves to operation 258 where a plurality of average delays for the transistor model over the generated plurality of ratios is generated. For example, with reference to FIG. 2A, if the ratio is set to 1, then an average delay is represented by a point D. The average delay is essentially a delay value that is calculated by measuring the total serial delay that a chain of standard cells would see if a plurality of identical standard cells with identical capacitance loads were connected in series, and then dividing by the number of identical cells being driven. As shown in Equation 1, each of the D's represent a delay between an input and an output of a particular standard cell (e.g., an inverter standard cell) that is connected in series, and N represents the number of standard cells connected in series. By calculating the "average" delay of a standard cell, a more accurate estimate of delay for both rising and falling transistors can be obtained for a single standard cell.

$$\{D_1+D_2+D_3+D_N\}/\{N\}=\text{Average Delay} \tag{1}$$

Once the plurality of average delays for the transistor structure over the generated plurality of ratios is produced in operation 258, the resulting plurality of ratios are plotted against the plurality of average delays as shown in FIG. 2A to produce plot 220. Upon producing plot 220, if graphical analysis is desired, the method will proceed to operation 260. In operation 260, a minimum average delay is identified by finding an optimum ratio or a range of optimum ratios over the plurality of ratios. As described above, the optimum delay is preferably found at point A of curve 224. However, an optimum delay may lie across a range that may be defined between a point B and a point C, for example.

Once the optimum average delay has been identified in operation 260, the method proceeds to an operation 262. In operation 262, a standard cell having transistors to be sized in accordance with the found optimum ratio is identified. For example, if the standard cell is for an inverter, both the P-type and the N-type transistor widths will be optimized in accordance with the identified optimum ratio to achieve the optimum delay in operation 264. It should be noted that it does not matter what the standard cell's height is because the chosen ratio is generic and will apply to any size standard cell. Once the transistors have been sized appropriately, the method will end.

Figure 3:
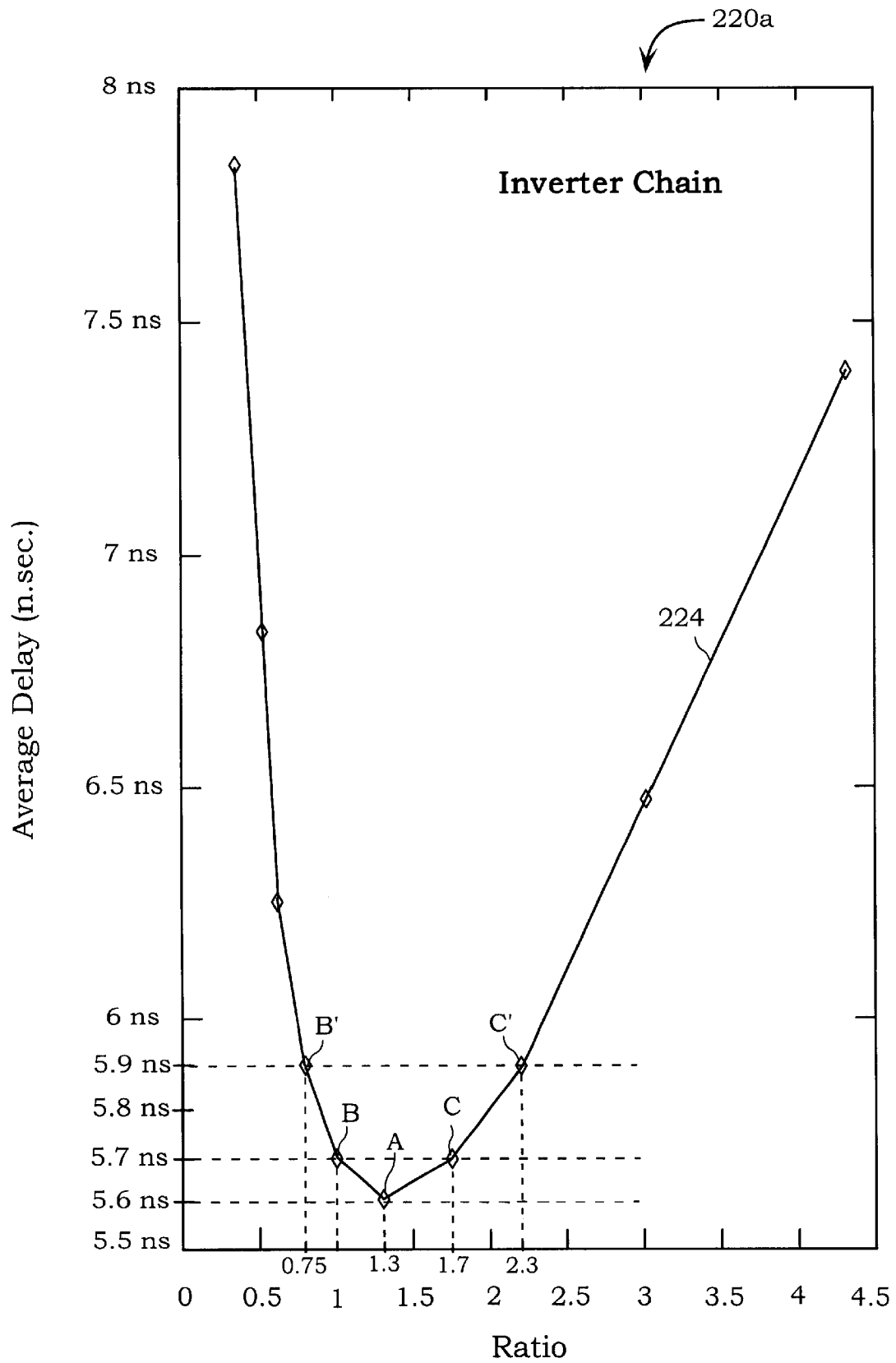
FIG. 3 illustrates a plot of delay vs. ratio for an inverter standard cell in accordance with one embodiment of the present invention.

FIG. 3 illustrates a plot 220a of an inverter standard cell in accordance with one embodiment of the present invention. In this example, the delay for an inverter is plotted along the Y-axes in nanoseconds, and the ratio of the P-type transistor gate width divided by the gate width of the N-type transistor is plotted along the X-axes. In this representative plot, the curve 224 has a minimum at a point A, which produces a ratio of about 1.3. As mentioned above, the actual ratio that may be acceptable for a particular standard cell geometry configuration may well lie between an acceptable range between, for example, points B and C.

In this example, point B may provide a ratio of 1 and a delay of about 5.7 nanoseconds. Point C will also provide a delay of about 5.7, however, the ratio is shown to be about 1.7. The minimum ratio is shown to provide a delay of about 5.6 nanoseconds. It is important to note that the curve 224 will also provide a designer with valuable pictorial information in selecting a ratio between the gate width of the P-type transistors relative to the gate width of the N-type transistors in a CMOS standard cell design, while at the same time achieving the most optimum average delay for the geometric configuration. To illustrate this flexibility, the designer may even choose to widen the acceptable range of delay for a particular standard cell when a given geometric constraint is being applied to the standard cell. In another embodiment of the present invention, the teachings described herein will also enable a designer to identify where an unacceptable ratio range may lie as well.

For example, the designer may wish to have the acceptable ratio range between 0.75 at a point B', which provides a delay of 5.9 nanoseconds and up to a ratio of 2.3 at a point C', which provides a delay slightly above 5.9 nanoseconds. Accordingly, by selecting the most optimum delay for the inverter standard cell, the designer can build the best configured standard cell geometric configuration for the application without having to settle on a fixed prior art ratio that was purely governed by the desire to have a balanced standard cell drive characteristic.

Figure 4:
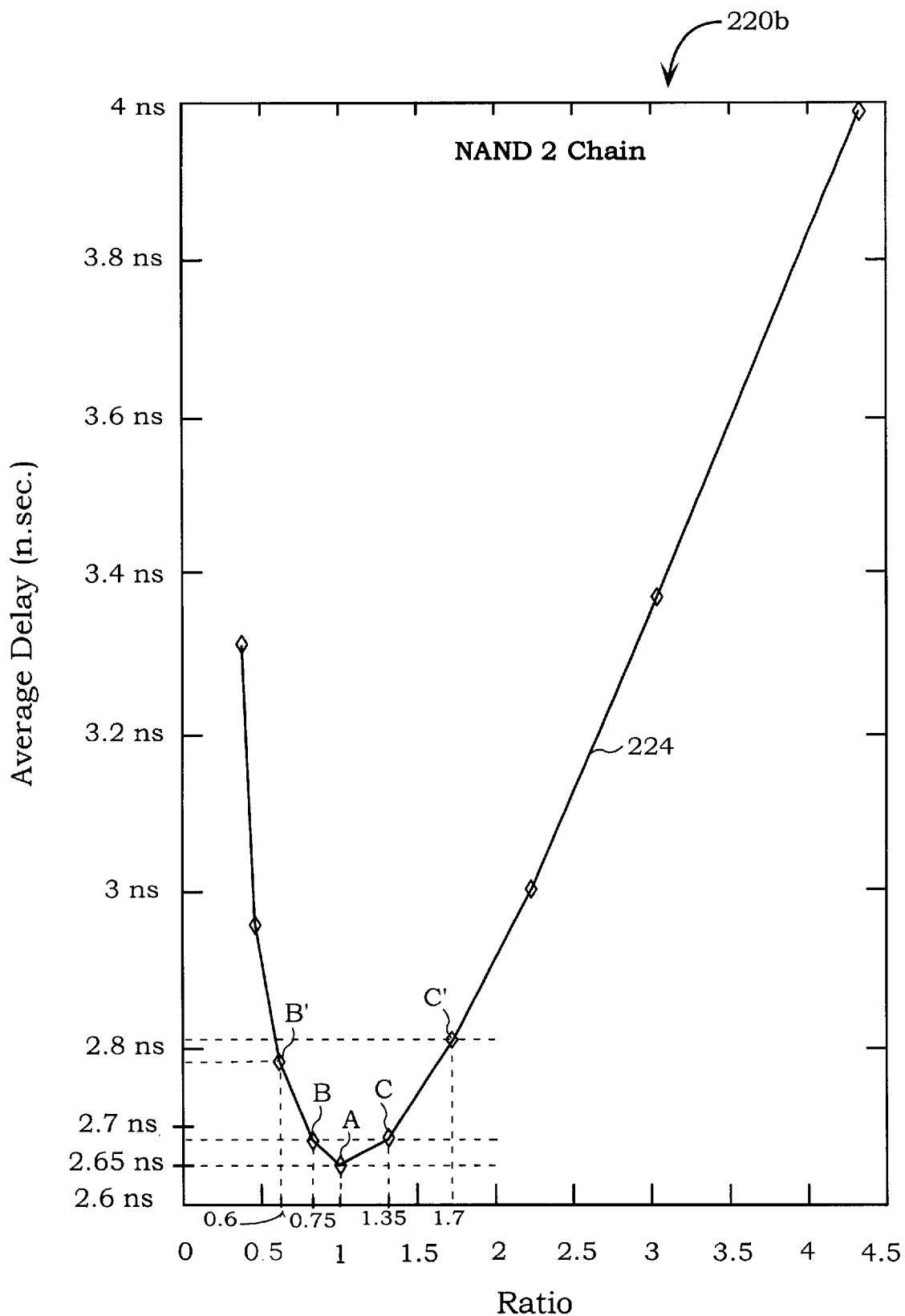
FIG. 4 illustrates a plot of delay vs. ratio for a NAND-2 standard cell in accordance with one embodiment of the present invention.

FIG. 4 illustrates a plot 220b of a NAND-2 standard cell in accordance with one embodiment of the present invention. In this plot, curve 224 takes on a different curve characteristic than that of the inverter of FIG. 3, however, a minimum at a point A is still obtained, albeit, at a ratio of about 1. When the ratio of 1 is set, the delay may be about 2.65 nanoseconds. However, the designer may be presented with the flexibility of varying the ratio between about 0.75 and about 1.35, between points B and C, respectively. If even a greater range is desired and deemed to be acceptable, and the designer may elect to have a delay that does not exceed about 2.8 nanoseconds and therefore set the range of acceptable ratios to be between about 0.6 and about 1.7 (i.e., between points B' and C' along the curve 224). Once the acceptable ratio or ratios have been identified, either graphically or numerically, the designer may design the particular transistor gate widths for the particular standard cell circuit.

Figure 5A:
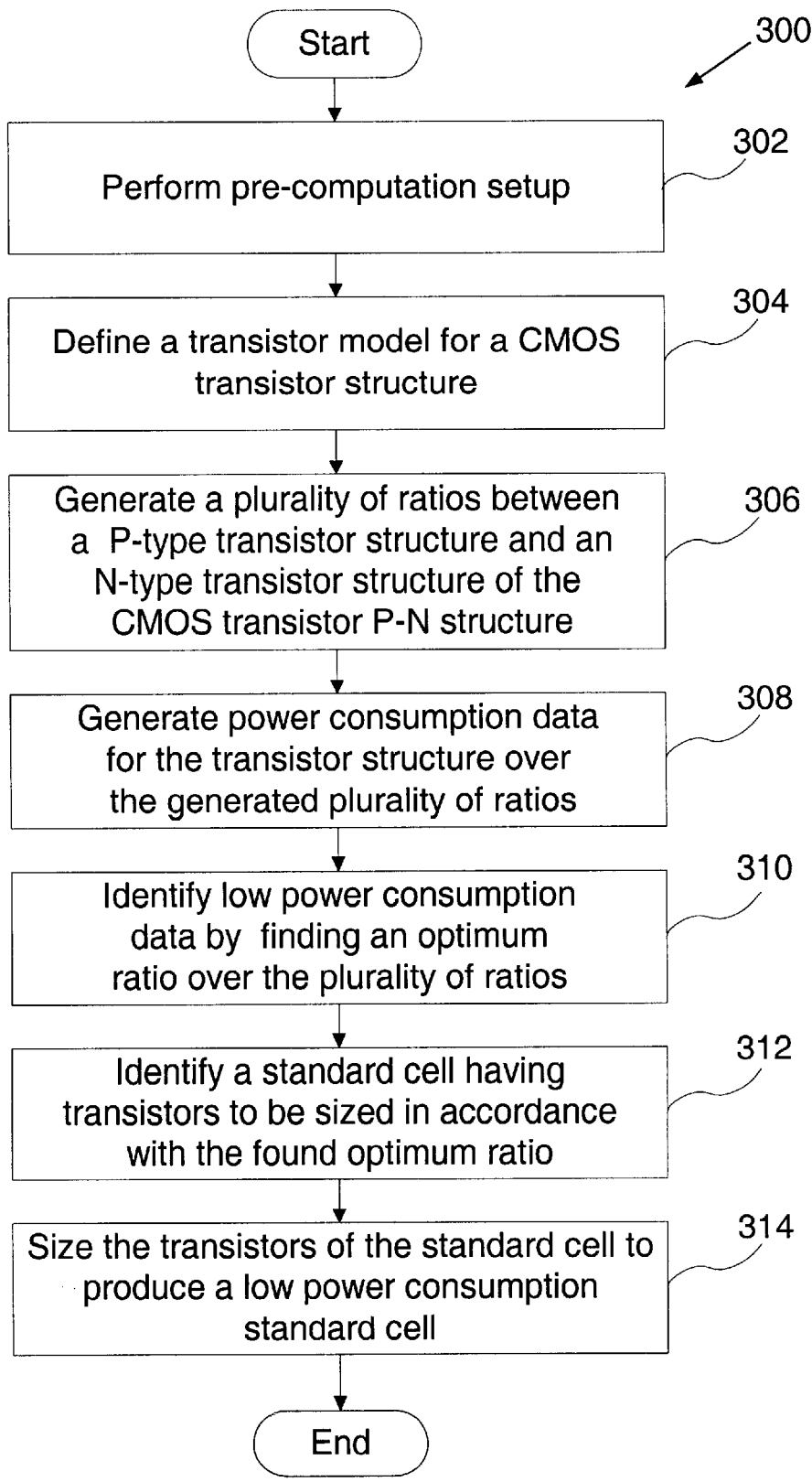
FIGS. 5A and 5B illustrate a CMOS transistor gate width optimization performed in order to achieve a desired power consumption profile for a standard cell design, in accordance with another embodiment of the present invention.
Figure 5B:
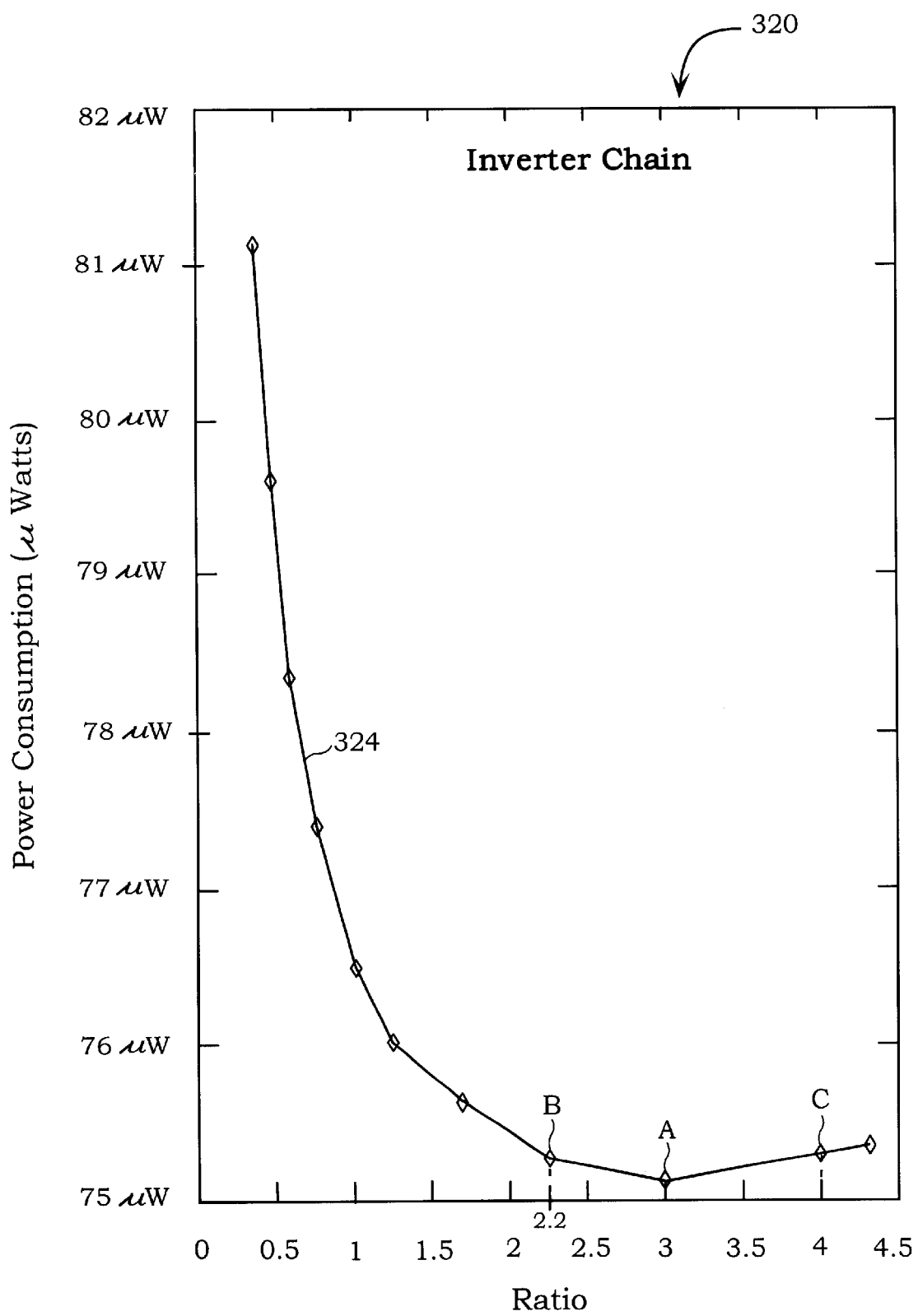

FIGS. 5A and 5B illustrate a CMOS transistor gate width ratio optimization performed in order to achieve a desired power consumption profile for a standard cell design. FIG. 5A illustrates a method 300 in accordance with this embodiment, beginning at an operation 302. In operation 302, pre-computation setup is performed. As mentioned above, the pre-computation setup initially requires for the designer to provide a starting cell height $H_{cell}$. Once the cell height has been provided, a set of design rules consistent with the technology that will be implemented to layout the geometric features of the standard cell will be provided.

Upon completing the pre-computation setup in operation 302, the method will proceed to an operation 304 where a transistor model for a CMOS transistor structure will be defined. As mentioned above, the transistor model for a CMOS transistor structure is the model that enables simulation of the behavioral response of the standard cell transistors once implemented in silicon. After the transistor model for the CMOS transistor structure has been defined in operation 304, the method will proceed to an operation 306 where a plurality of ratios between a P-type transistor and an N-type transistor of the CMOS transistor structure are generated.

Although the range may be quite large, for practical purposes, the ratios between the P-type transistor gate widths and the N-type transistor gate widths will preferably range between 0.1 and about 20. Of course, the practical ratio range will depend upon the type of standard cell being optimized for minimum power consumption. The method now proceeds to an operation 308 where power consumption data for the transistor structure over the generated plurality of ratios is generated. Once the power consumption data has been generated, a plot 320 such as that illustrated in FIG. 5B, may be produced. Of course, the designer does not necessarily have to generate a computer plot display of the data and may choose analyze the data in a numerical column display.

In operation 310, low power consumption data is identified by finding an optimum ratio over the plurality of ratios. In FIG. 5B, the range may span between a point B having a ratio of about 2.2 to a point C having a ratio of about 4. In this example, curve 324 will have a low power consumption point at point A, which defines a ratio of about 3. Once the low power consumption data point or ranges of data points are identified in order to select a minimum ratio or ratios for reduced power consumption, the method will proceed to an operation 312. In operation 312, a standard cell having transistors to be sized in accordance with the found optimum ratio or ratios is identified.

For example, if the standard cell is an inverter cell (i.e., a plot which is shown in FIG. 5B), the ratio of transistors in the standard cell are sized to produce the desired low power consumption standard cell in operation 314. Once the transistors have been sized appropriately, the method for producing a low power consumption standard cell will be complete.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for designing standard cell transistor layouts, comprising:

defining a transistor model for a P-type transistor and an N-type transistor of a CMOS standard cell for implementing a type of logic circuit; and optimizing a ratio between the P-type transistor and the N-type transistor, the ratio being defined by dividing a P-type gate width of the P-type transistor by an N-type gate width of the N-type transistor, the optimizing being performed by substantially minimizing an average delay for the transistor model of the CMOS standard cell independently without regard to adjacent CMOS standard cells.

2. A method for designing standard cell transistor layouts as recited in claim 1, further comprising:

identifying a type of transistor structure for the optimization.

3. A method for designing standard cell transistor layouts as recited in claim 2, wherein the average delay is calculated based on the type of transistor structure that defines the type of logic circuit; and connecting two or more of the type of logic circuits in series so that each of the two or more logic circuits has an input and an output and a specific delay;

adding the specific delay between the input and the output for each of the two or more logic circuits to produce a delay sum; and dividing the delay sum by a number equal to the two or more specific delays.

4. A method for designing standard cell transistor layouts as recited in claim 3, further comprising:

setting starting parameters, the setting including,
providing a starting cell height of the CMOS standard cell, wherein the starting cell height is along a same direction of the P-type gate width and the N-type gate width; and
defining a set of design rules for laying out the type of logic circuit.

5. A method for designing standard cell transistor layouts as recited in claim 4, wherein the set of design rules are defined for a particular process technology.

6. A method for designing standard cell transistor layouts as recited in claim 3, wherein the transistor model defines a behavior description in silicon of the P-type transistor and the N-type transistor of the type of logic circuit, the behavior description in silicon enabling detailed analysis.

7. A method for designing standard cell transistor layouts as recited in claim 2, further comprising:

implementing a computer simulator that uses the transistor model and the type of transistor structure to produce an average delay data range, the average delay data range being configured to vary over a ratio range of the ratio.

8. A method for designing standard cell transistor layouts as recited in claim 7, wherein the optimizing further comprises:

sweeping across the ratio range in order to identify a range of acceptable average delay data within the average delay data range, the range of acceptable average delay data including a minimum average delay for the transistor model.

9. A method for designing standard cell transistor layouts as recited in claim 8, further comprising:

plotting the average delay data range versus the ratio range in order to graphically identify the range of acceptable average delay and associated ratios in the ratio range.

10. A method for sizing transistors of a standard cell, comprising:

defining a transistor structure for the standard cell, the transistor structure defining a logic circuit that is pre-designed for the standard cell upon being interconnected using interconnect metallization and conductive vias structures;

defining a transistor model for a P-type transistor and an N-type transistor of the standard cell, the P-type transistor being oriented on a first side of the standard cell and the N-type transistor being oriented on a second side of the standard cell;

generating a plurality of ratios between the P-type transistor and the N-type transistor, each of the plurality of ratios being derived by dividing a P-type gate width of the P-type transistor by an N-type gate width of the N-type transistor;

generating a plurality of average delays for the transistor structure of the standard cell, each of the generated plurality of average delays associated with corresponding ones of the plurality of ratios between the P-type transistor and the N-type transistor; and identifying an optimum ratio from the plurality of ratios between the P-type transistor and the N-type transistor by finding a low one of the plurality of average delays, the identifying being without regard to average delays of adjacent standard cells.

11. A method for sizing transistors of a standard cell as recited in claim 10, wherein the low one of the plurality of average delays is used to size the ratio of the P-type gate width of the P-type transistor and the N-type gate width of the N-type transistor.

12. A method for sizing transistors of a standard cell as recited in claim 10, wherein each of the plurality of average delays is dependent on the type of transistor structure that defines the logic circuit, and is further determined by the operations of:

connecting two or more of the logic circuits in series so that each of the two or more logic circuits has an input, an output, and a specific delay;

adding the specific delay between the input and the output for each of the two or more logic circuits to produce a delay sum; and dividing the delay sum by a number equal to the two or more specific delays.

13. A method for sizing transistors of a standard cell as recited in claim 10, further comprising:
   setting starting parameters, the setting including,
      providing a starting cell height of the standard cell, wherein the starting cell height is defined along a same direction of the P-type gate width and the N-type gate width; and
      defining a set of design rules for laying out the logic circuit of the standard cell.

14. A method for sizing transistors of a standard cell as recited in claim 13, wherein the set of design rules is defined for a particular process technology.

15. A method for sizing transistors of a standard cell as recited in claim 10, wherein the logic circuit is part of a library of logic circuits.

16. A method for sizing transistors of a standard cell as recited in claim 10, wherein the transistor model defines a behavior description in silicon of the P-type transistor and the N-type transistor of the type of logic circuit.

17. A method for sizing transistors of a standard cell as recited in claim 10, further comprising:
   plotting the plurality of ratios between the P-type transistor and the N-type transistor versus the plurality of average delays in order to graphically identify a range of acceptable average delay and associated ratios.

18. A method for sizing transistors of a standard cell for reduced power consumption, comprising:
   defining a transistor structure for the standard cell, the transistor structure defining a logic circuit that is pre-designed for the standard cell upon being interconnected using interconnect metallization and conductive vias structures;
   defining a transistor model for a P-type transistor and an N-type transistor of the standard cell, the P-type transistor being oriented on a first side of the standard cell and the N-type transistor being oriented on a second side of the standard cell;
   generating a plurality of ratios between the P-type transistor and the N-type transistor, each of the plurality of ratios being derived by dividing a P-type gate width of the P-type transistor by an N-type gate width of the N-type transistor;
   generating a plurality of power consumption data for the transistor structure of the standard cell, each of the generated plurality of power consumption data being associated with corresponding ones of the plurality of ratios between the P-type transistor and the N-type transistor; and
   identifying an optimum ratio from the plurality of ratios between the P-type transistor and the N-type transistor by finding a low one of the plurality of power consumption data, the identifying being without regard to power consumption of adjacent standard cells.

19. A method for sizing transistors of a standard cell for reduced power consumption as recited in claim 12, wherein the low one of the plurality of power consumption data is used to size the P-type gate width of the P-type transistor and the N-type gate width of the N-type transistor.

20. A method for sizing transistors of a standard cell for reduced power consumption as recited in claim 19, further comprising:
   setting starting parameters, the setting including,
      providing a starting cell height of the standard cell, wherein the starting cell height is defined along a same direction of the P-type gate width and the N-type gate width; and
      defining a set of design rules for laying out the logic circuit of the standard cell.

21. A method for sizing transistors of a standard cell for reduced power consumption as recited in claim 20, wherein the set of design rules is defined for a particular process technology.

22. A method for sizing transistors of a standard cell for reduced power consumption as recited in claim 21, wherein the logic circuit is part of a library of logic circuits.

* * * * *